(12) United States Patent
Ngo et al.

(10) Patent No.: US 6,875,694 B1
(45) Date of Patent: Apr. 5, 2005

(54) METHOD OF TREATING INLAID COPPER FOR IMPROVED CAPPING LAYER ADHESION WITHOUT DAMAGING POROUS LOW-K MATERIALS

(75) Inventors: Minh Van Ngo, Fremont, CA (US); Robert Huertas, Hollister, CA (US); Hieu Pham, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/774,418

(22) Filed: Feb. 10, 2004

(51) Int. Cl.[7] ............................................. H01L 21/44
(52) U.S. Cl. ..................... 438/687; 438/622; 438/624; 438/631; 438/637; 438/645
(58) Field of Search ............................... 438/622, 624, 438/631, 637, 645, 687

(56) References Cited

U.S. PATENT DOCUMENTS

| | | | |
|---|---|---|---|
| 6,165,894 A | 12/2000 | Pramanick et al. | |
| 6,638,875 B2 * | 10/2003 | Han et al. | 438/725 |
| 6,686,273 B2 * | 2/2004 | Hsu et al. | 438/638 |
| 6,737,747 B2 * | 5/2004 | Barth et al. | 257/760 |
| 6,790,770 B2 * | 9/2004 | Chen et al. | 438/637 |

* cited by examiner

*Primary Examiner*—Michael Tran
*Assistant Examiner*—Renee R. Berry

(57) ABSTRACT

An exposed surface of inlaid Cu is plasma treated for improved capping layer adhesion while controlling plasma conditions to avoid damaging porous low-k materials. Embodiments include forming a dual damascene opening in a porous dielectric material having a dielectric constant (k) of up to 2.4, e.g., 2.0 to 2.2, filling the opening with Cu, conducting CMP, plasma treating the exposed Cu surface in $NH_3$ or $H_2$ at a low power, e.g., 75 to 125 watts, for a short period of time, e.g., 2 to 8 seconds, without etching the porous low-k material and depositing a capping layer, e.g., silicon nitride or silicon carbide.

20 Claims, 6 Drawing Sheets

METHOD OF TREATING INLAID COPPER FOR IMPROVED CAPPING LAYER ADHESION WITHOUT DAMAGING POROUS LOW-K MATERIALS

FIELD OF THE INVENTION

The present invention relates to a method of treating copper (Cu) and/or Cu alloy metallization for improved capping layer adhesion without damaging associated porous low-k materials. The present invention is particularly applicable in fabricating high-speed integrated circuits having sub-micron designed features and reliable high conductivity interconnect structures.

Interconnection technology is constantly challenged to satisfy the ever increasing requirements for high density and performance associated with ultra large scale integration semiconductor devices. The speed of semiconductor circuitry varies inversely with the resistance (R) and capacitance (C) of the interconnection system. The higher the value of the R×C product, the more limiting the circuit speed. As integrated circuits become more complex and feature sizes and spacings become smaller, the integrated circuit speed becomes less dependent upon the transistor itself and more dependent upon the interconnection pattern. Thus, the performance of multi-level interconnects is dominated by interconnect capacitance at deep sub-micron regimes.

The dielectric constant of materials currently employed in the manufacture of semiconductor devices for an inter-layer dielectric (ILD) ranges from about 3.9 for dense silicon dioxide to over 8 for deposited silicon nitride. The value of the dielectric constant expressed herein is based upon a value of one for a vacuum. In an effort to reduce interconnect capacitance, dielectric materials with lower values of permitivity have been explored. The expression "low-k" material has evolved to characterize materials with a dielectric constant less than about 3.9. Organic low-k materials which offer promise are carbon-containing dielectric materials such as FLARE 20™ dielectric, a poly(arylene) ether, available from Allied Signal, Advanced Micromechanic Materials, Sunnvale, Calif., Black-Diamond™ dielectric available from Applied Materials, Santa Clara, Calif., BCB (divinylsiloxane bis-benzocyclobutene) and SiLK™ dielectric, an organic polymer similar to BCB, both available from Dow Chemical Co., Midland, Mich. Another example is porous, low density materials in which a significant fraction of the bulk volume contains air. The properties of these porous materials are proportional to their porosity. For example, at a porosity of about 80%, the dielectric constant of a porous silica film, i.e. porous $SiO_2$, is approximately 1.5.

Copper (Cu) and Cu alloys have received considerable attention as alternative metallurgy to aluminum (Al) in interconnect metallizations. Cu is relatively inexpensive, easy to process, and has a lower resistively than Al. In addition, Cu has improved electrical properties vis-à-vis tungsten (W), making Cu a desirable metal for use as a conductive plug as well as conductive wiring. However, due to Cu diffusion through dielectric materials, such a silicon dioxide, Cu interconnect structures must be encapsulated by a diffusion barrier layer. Typical diffusion barrier materials include tantalum (Ta), tantalum nitride (TaN), titanium (Ti), titanium nitride (TiN), tintanium-tungsten (TiW), Tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the ILD, but includes interfaces with other metals as well.

Cu interconnect technology, by and large, has been implemented employing damascene techniques, wherein an ILD, such as a silicon oxide layer, e.g., derived from tetraethyl orthosilicate (TEOS) or silane, or a low-k material, is formed over an underlying metal level containing metal features, e.g., Cu or Cu alloy features with a silicon nitride capping layer. A damascene opening, e.g., via hole, trench, or dual damascene opening, is then formed in the ILD. A barrier layer and optional seedlayer are then deposited, followed by Cu deposition, as by electrodeposition or electroless deposition.

Additional problems have been encountered attendant upon conventional Cu interconnect methodology employing a diffusion barrier layer (capping layer). For example, it was found that after conducting chemical-mechanical polishing (CMP) of an inlaid Cu or Cu alloy layer, a deposited capping layer, such as silicon nitride, exhibited poor adhesion to the Cu or Cu alloy surface. Such poor adhesion rendered the capping layer vulnerable to removal, as by peeling due to scratching or stresses resulting from subsequent processing. Consequently, the Cu or Cu alloy is not entirely encapsulated resulting in Cu diffusion, thereby adversely impacting device performance and decreasing the electromigration resistance of the interconnect.

An approach to the poor capping layer adhesion problem comprises treating the upper surface of the inlaid Cu or Cu alloy with a plasma, such as a hydrogen ($H_2$) plasma or an ammonia ($NH_3$) plasma, to remove the copper oxide thereby presenting a relatively clean surface for capping layer adhesion.

However, upon conducting experimentation into the use of copper interconnect technology using porous low-k materials, it was found that such $NH_3$ and $H_2$ plasma treatment degraded the porous low-k material. For example, adverting to FIG. 1, an interlayer dielectric (ILD) comprising a porous low-k material 12 is formed over underlying conductive features 11 in dielectric layer 10. Porous low-k material 12 may comprise, for example, SiLK™. Dual damascene openings are then formed and a barrier metal layer 13 deposited to line the openings. Cu or a Cu alloy is then deposited, with or without an optional seedlayer, and CMP conducted resulting in the intermediate structure depicted in FIG. 1 comprising a lower via. 14A communicating with an upper line 14B of a Cu or Cu alloy. The upper surface of the inlaid copper has an undesirable layer of a copper oxide 15, which adversely impacts capping layer adhesion. The upper surface 12A of ILD 12 is typically coplanar with the upper surface of the Cu or Cu alloy layer.

It was found, however, upon plasma treating the exposed upper surface 15 of the inlaid Cu or Cu alloy to remove the undesirable layer of copper oxide 15, the porous low-k layer 12 was undesirably etched, as shown in FIG. 2. The original upper surface 12A of ILD 12 is etched resulting in the lowered surface 12A', by a distance of "D", which may extend up to 2,000 Å, e.g., typically about 500 Å to 2,500 Å.

Subsequently, a capping layer 30 is deposited, such as silicon nitride, resulting in the intermediate structure depicted in FIG. 3 and an undesirable step "D" of up to 2,000 Å. Such irregular surface typography generates various problems, such as an undesirable significant reduction in the thickness of the ILD, degradation of the low-k property of the ILD and extremely poor within-wafer thickness uniformity.

Accordingly, there exists a need for methodology enabling the fabrication of semiconductor devices comprising copper interconnects in conjunction with porous low-k dielectric materials. There exists a particular need for methodology enabling the formation of Cu and/or Cu alloy interconnects with improved integrity without degradation of associated porous low-k materials.

DISCLOSURE OF THE INVENTION

An advantage of the present invention is a method of fabricating a semiconductor device having interconnect patterns exhibiting reduced parasitic R×C time delays employing porous dielectric materials having a low dielectric constant.

Another advantage of the present invention is a method of fabricating a semiconductor device comprising reliably capped Cu or Cu alloy interconnects in porous low-k dielectric layers without degradation or etching of the low-k dielectric layers.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended clams.

According to the present invention, the foregoing and other advantages are achieved in part by a method of fabricating a semiconductor device, the method comprising: forming an opening in an upper surface of a porous low-k dielectric layer; filling the opening with copper (Cu) or a Cu alloy; conducting chemical-mechanical polishing (CMP) leaving the upper surface of the Cu or Cu alloy exposed; and treating the upper surface of the Cu or Cu alloy with a plasma while controlling plasma conditions to avoid etching the upper surface of the porous low-k material.

Embodiments of the present invention include forming a dual damascene opening in a dielectric layer having a dielectric constant (k) no greater than 2.4, and typically having a k value of 2.0 to 2.2, depositing a barrier metal layer, such as tantalum, tantalum nitride or a composite layer of tantalum nitride and alpha (α)-tantalum, filling the opening with Cu or Cu alloy, with or without the use of a seedlayer, conducting CMP leaving an upper surface of the Cu or Cu alloy exposed and containing a layer of copper oxide thereon, and treating the upper surface with an NH$_3$ or H$_2$ plasma at a power of 75 to 125 watts for 2 to 8 seconds to remove the layer of copper oxide while preventing etching and/or degradation of the porous low-k material. Subsequently, a capping layer, such as silicon nitride or silicon carbide, is deposited, typically at a thickness of 250 Å to 550 Å.

Another aspect of the present invention is a method of fabricating a semiconductor device, the method comprising: forming a dual damascene opening in an upper surface of a porous dielectric layer having a dielectric constant up to 2.2; depositing a barrier layer lining the opening; filling the opening with Cu or a Cu alloy; conducting CMP leaving an upper surface of the Cu or Cu alloy exposed; treating the exposed upper surface of the Cu or Cu alloy in a NH$_3$ or H$_2$ plasma at a power of 75 watts to 125 watts for 2 to 8 seconds; and depositing a capping layer.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded and illustrative in nature, and not as restrictive.

BRIEF DESCRIPTION OF THE DRAWINGS

In FIGS. 1 through 6, similar features are devoted by similar reference characters.

DESCRIPTION OF THE INVENTION

The present invention addresses and solves problems attendant upon fabricating multi-layer interconnect devices, particularly parasitic R×C time delays. The capacitance, both layer-to-layer and within-layer, is primarily attributed to the film properties of the ILD. The present invention enables efficient implementation of multi-level interconnect technology using Cu and/or Cu alloys with various porous low-k dielectric materials for ILDs, by providing methodology enabling formation of reliably capped Cu and/or Cu alloy interconnects, without or with significantly reduced degradation and/or etching of the porous low-k dielectric materials. As employed throughout this disclosure, the symbol Cu is intended to encompass high purity elemental copper as well as copper-based alloys, such as copper alloys containing minor amounts of tantalum indium, tin, zinc, manganese, titanium, germanium, zirconium, strontium, palladium, magnesium, chromium and tantalum.

Figure 2:
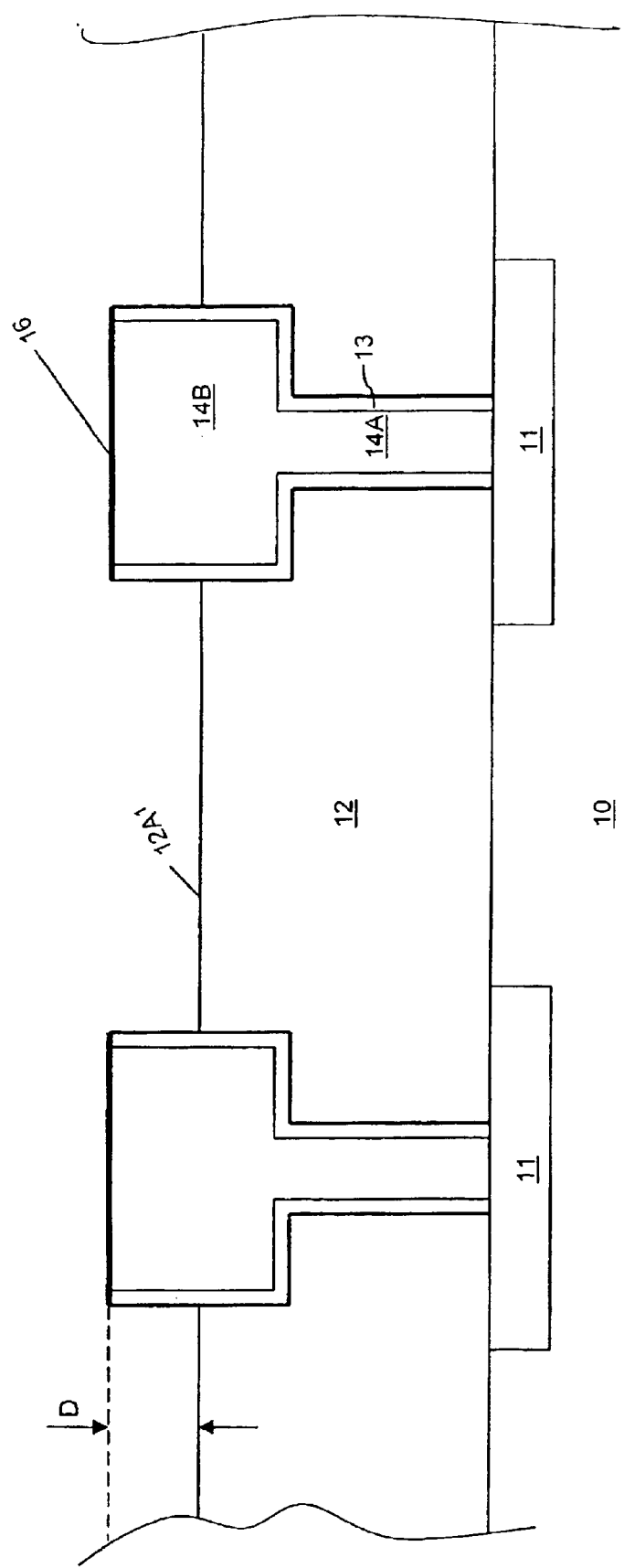
Figure 3:
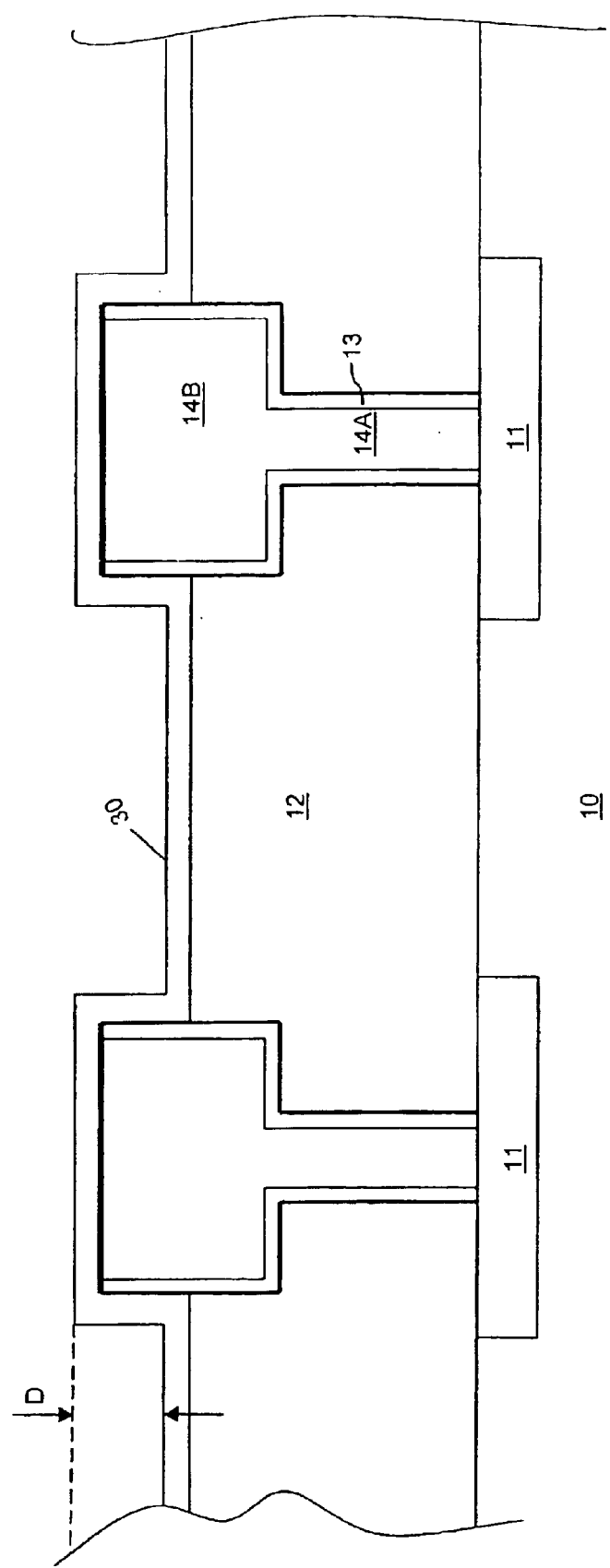

Experimentation and investigations were initially conducted to develop ways of implementing Cu interconnect technology with porous low-k materials, such as SiLK™. However, as illustrated in FIGS. 2 and 3, it was found that during plasma treatment of the exposed inlaid Cu to remove copper oxide in order to enhance capping layer adhesion, the porous low-k materials were etched and degraded. Consequently, the thickness of the porous low-k ILD layers were undesirably reduced, and within-wafer thickness uniformity became very problematic.

Accordingly, continued experimentations and investigations were conducted to develop methodology enabling the complete reduction of copper oxide on the exposed inlaid Cu without damaging or etching the associated porous low-k materials. It was found that the exposed Cu surface could be effectively removed of copper oxide without damaging porous low-k materials by strategically controlling the power and time during plasma treatment. It was found that by significantly reducing the power, as to a power of 75 watts to 125 watts, and by reducing the plasma treatment, as to 2 to 8 seconds, copper oxide could be totally removed from the exposed upper surface of the inlaid Cu without degradation or appreciable etching of the associated porous low-k ILD. Experimental results confirmed embodiments of the present invention resulted in high thickness uniformity and retention of refractive index (RI) of the porous low-k ILD.

Embodiments of the present invention comprise forming a dual damascene opening in a porous low-k material typically a dielectric material having a dielectric constant (k) of up to 2.2, e.g., 2.0 to 2.2. A barrier metal layer is then deposited in the opening, which may also be a single damascene opening, such as a via hole or a trench. Such barrier metal layers may comprise tantalum, tantalum nitride, or a composite of tantalum nitride and α-tantalum. A seedlayer may optionally be deposited. The opening is then filled with Cu forming an overburden on the upper surface of the ILD. CMP is then implemented resulting in an exposed upper surface of the inlaid Cu having copper oxide thereon, which copper oxide adversely impacts capping layer adhesion. The exposed upper surface of the inlaid Cu is then treated with a plasma. For example, embodiments of the present invention comprise treating the upper surface of the inlaid Cu with an $NH_3$ plasma at an $NH_3$ flow rate of 100 to 700 sccm, a nitrogen ($N_2$) flow rate of 2,000 to 9,000 sccm, a power of 75 to 125 watts, a pressure of 4.0 to 5.2 Torr and a temperature of 300° C. to 400° C., for 2 seconds to 8 seconds. Embodiments of the present invention also include treating the exposed upper surface of the inlaid Cu with an $H_2$ plasma at: a $H_2$ flow rate of 100 to 400 sccm; a $N_2$ flow rate of 200 to 8,000 sccm; a power of 75 watts to 125 watts; a pressure of 4.0 to 5.2 torr and a temperature of 300° C. to 400° C. for 2 to 8 seconds. By controlling the plasma conditions, particularly the power and time, copper oxide can be totally removed from the upper surface of the inlaid Cu without degradation and/or etching of the associated porous low-k ILD.

Initial attempts to implement Cu interconnect technology employing porous low-k dielectric materials utilized a plasma treatment in $NH_3$ or $H_2$ at a power of 200 to 300 watts for about 30 to 40 seconds. However, such plasma treatments resulted in etching the porous low-k material up to about 2,000 Å thereby, generating the problems confronted by the present invention. By strategically reducing the power and time during plasma treatment to remove copper oxide, it was found that the copper oxide can be entirely removed without degrading and/or etching the associated porous low-k dielectric material.

Figure 1:
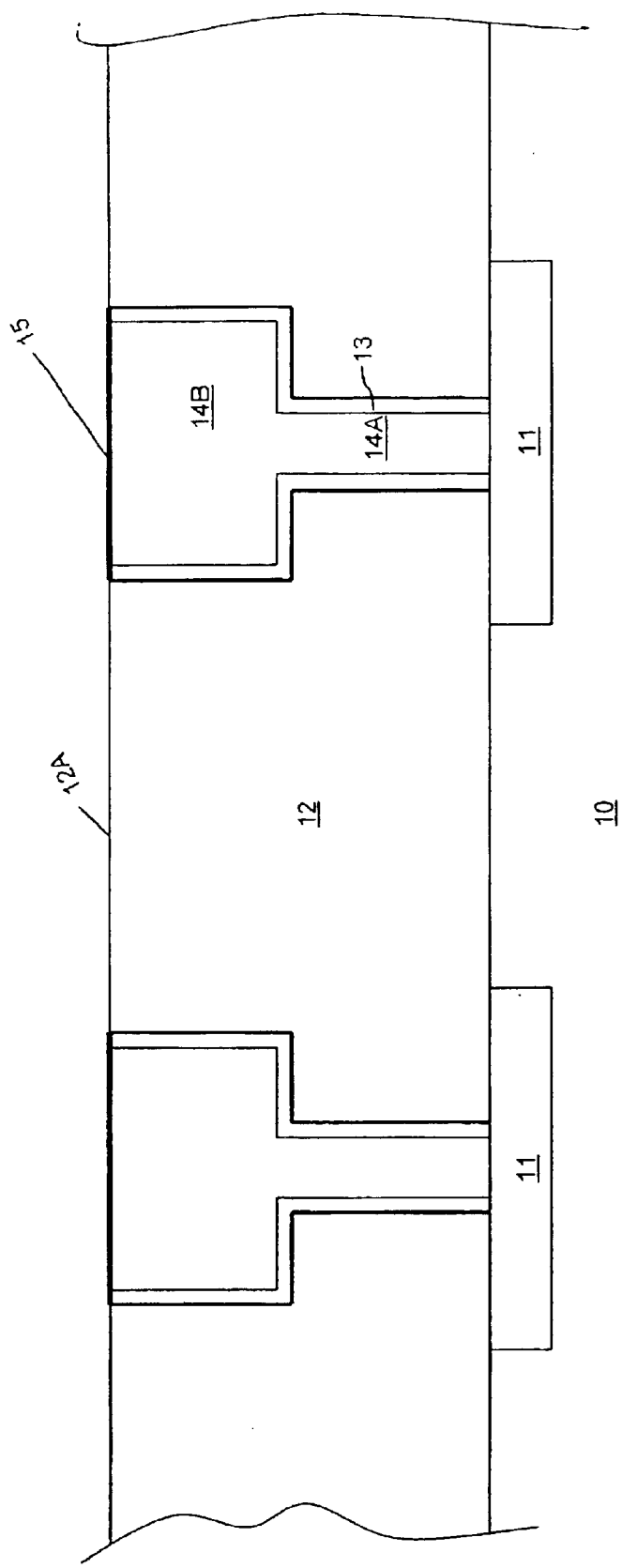
FIGS. 1 through 3 schematically illustrate a porous low-k etching problem addressed and solved by embodiments of the present invention.
Figure 4:
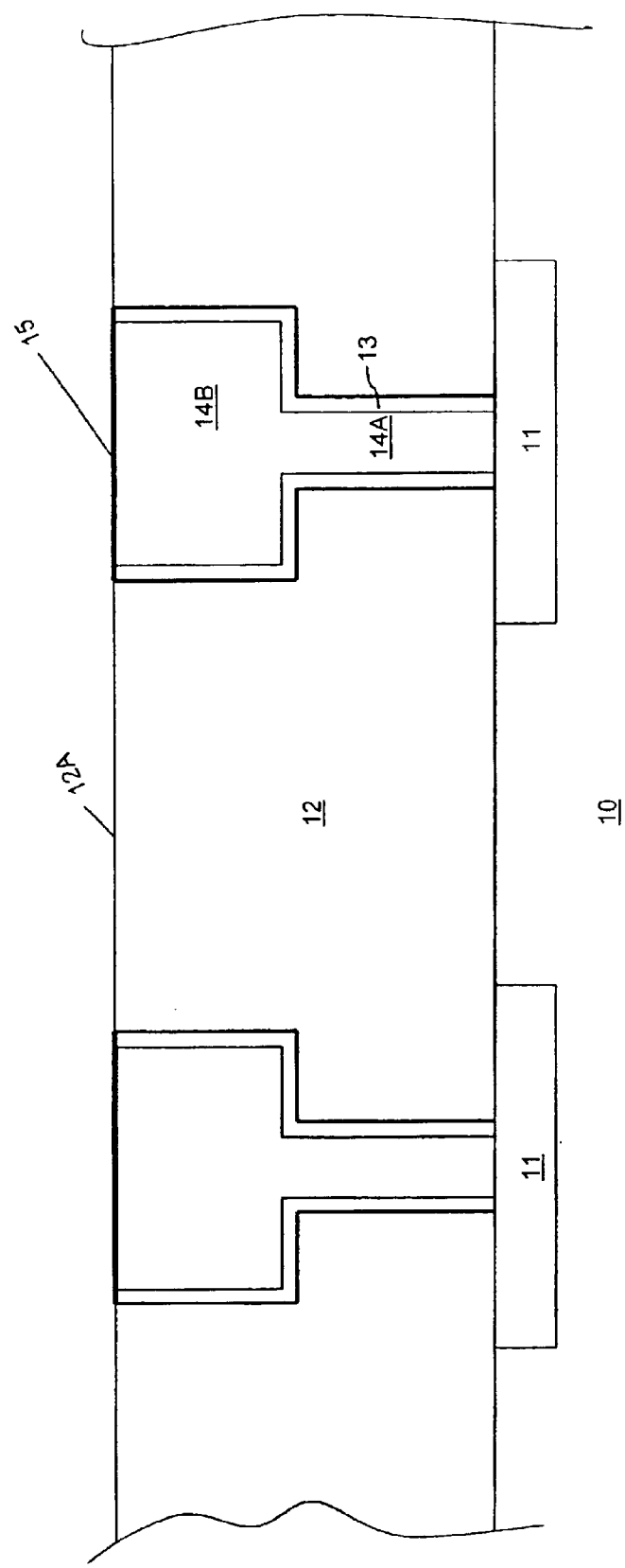
FIGS. 4 through 6 schematically illustrate sequential phases of a method in accordance with an embodiment of the present invention.
Figure 5:
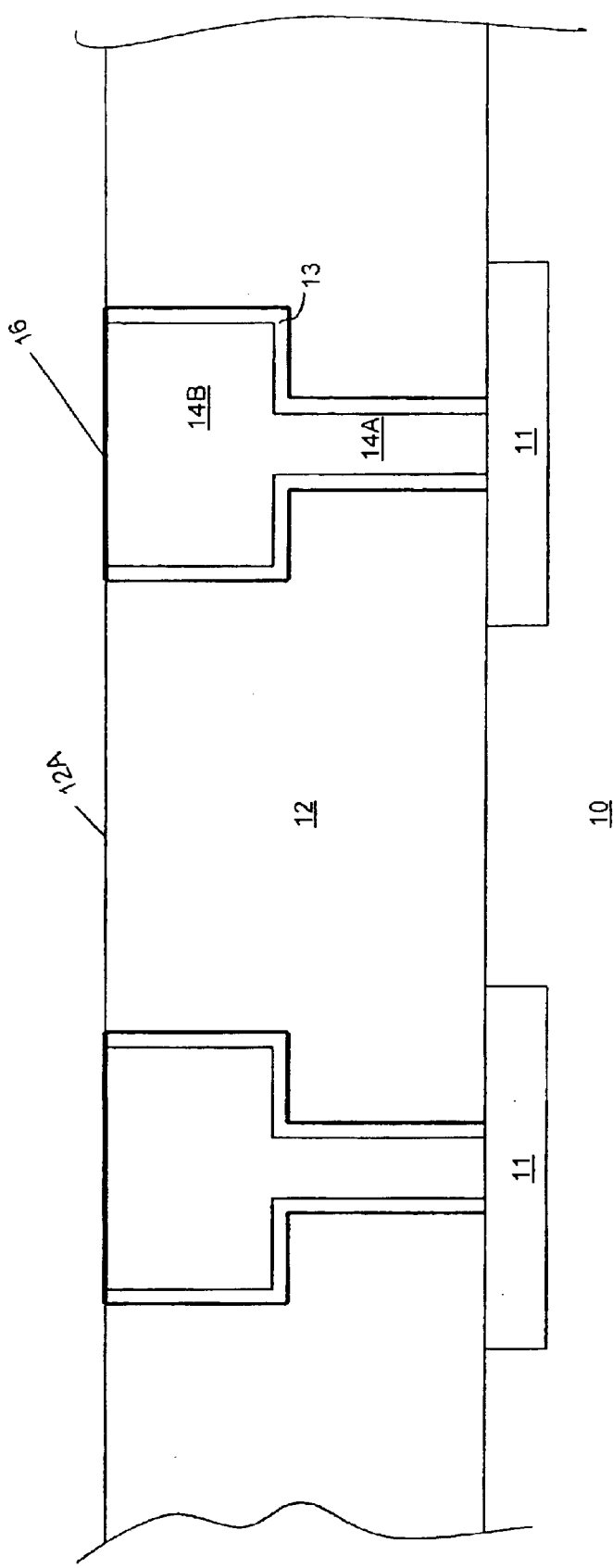
Figure 6:
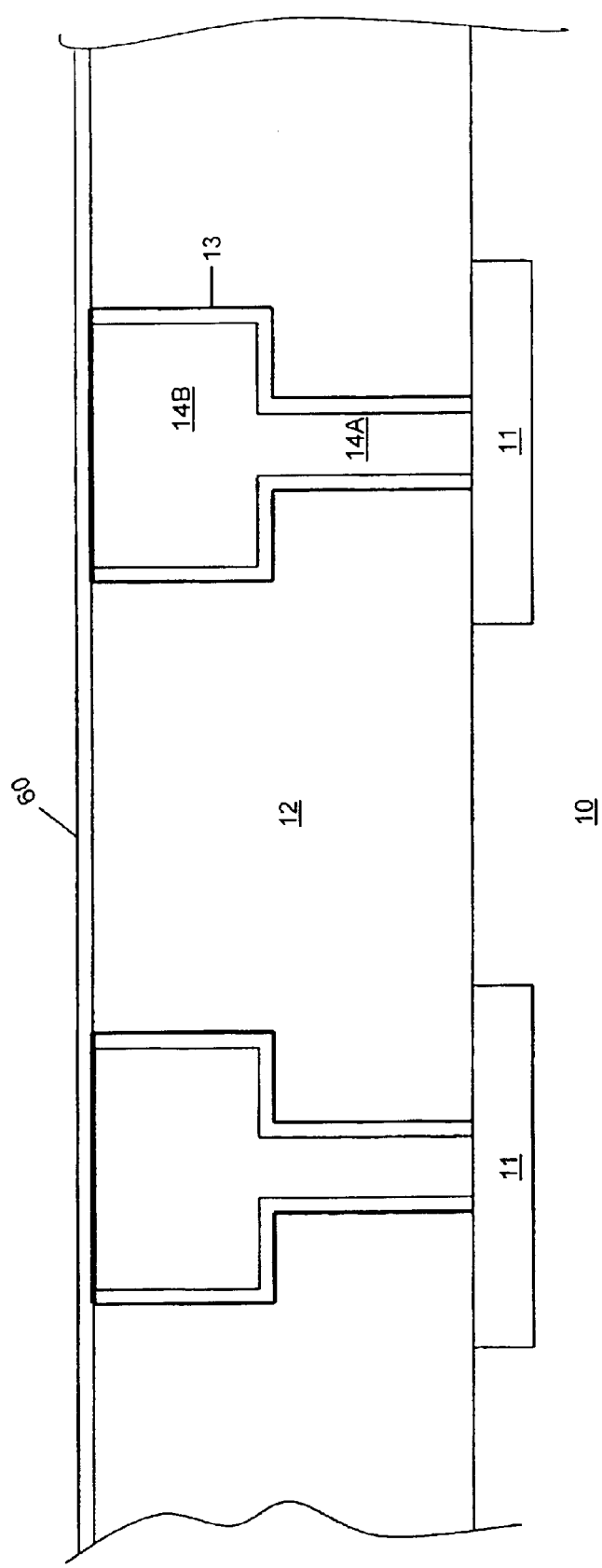

An embodiment of the present invention is schematically illustrated in FIGS. 4 through 6, wherein similar features are denoted by similar reference numerals as are those in FIGS. 1 through 3. FIG. 4 is similar to FIG. 1 representing an initial phase of an embodiment of the present invention, wherein a dual damascene Cu structure is formed comprising a lower via 14A electrical contact with an underlying conductor feature 11 and connected to an upper trench 14B formed in porous low-k dielectric material 12 with a barrier layer 13 lining the dual damascene opening. After CMP, an undesirable layer of copper oxide 15 is formed on the exposed surfaces of the inlaid Cu, thereby rendering it difficult to adequately cap the inlaid Cu. In accordance with the present invention, the upper surface of the inlaid Cu is treated with an $NH_3$ or an $H_2$ plasma under reduced power and for a shortened period of time, e.g., at a power of 75 watts to 125 watts for 2 seconds to 8 seconds, thereby completely removing the layer of copper oxide 15 from the upper surface of the inlaid Cu without etching the upper surface 12A of the porous dielectric layer 12, as illustrated in FIG. 5. It was found that by strategically reducing the power and shortening the time of plasma treatment, porous dielectric layer 12 is not degraded and there is minimal, if any, reduction in the height of the ILD 12. Removal of the undesirable Cu layer 15 presents a clean exposed surface 16 of the inlaid Cu, thereby enabling deposition of a capping layer 60, as shown in FIG. 6, with superior adhesion in order to seal in the dual damascene structure and, hence, prevent the generation of electromigration issues. Capping layer 60 may advantageously be deposited by plasma enhanced chemical vapor electrodeposition of silicon nitride or silicon carbide, as at a thickness of 250 Å to 550 Å.

A wide variety of low-k materials can be employed as an ILD in accordance with embodiments of the present invention, including various polyimides, BCB, FLARE™, SiLK™, and Black-Diamond™ dielectrics. Other suitable low-k dielectrics include poly(arylene)ethers, poly(arylene) ether azoles, parylene-N, polyimides, polynapthalene-N, polyphenyl-quinoxalines, polyphenyleneoxide, polyethylene, polypropylene and SiCOH which exhibits a dielectric constant of about 3 and contains SiC, SiH, CH and SiOH bonding. Other suitable low-k dielectric materials include fluorosilicate glass (FSG or SiOF), hydrogenated diamond-like carbon (DLC), polystyrene, fluorinated polyimides, parylene (AF-4), polyarylene ether, and polytatrafluoro ethylene. The present invention advantageously enables the use of porous low-k dielectric materials, such as siloxanes, silsesquioxanes, aerogels, and xerogels, typically having a porosity of about 10 to about 20%.

The present invention enables fabricating semiconductor devices having multi-level interconnect patterns based upon Cu and porous low-k dielectric materials, without degradation and/or etching thereof during plasma treatment to remove copper oxide from exposed inlaid Cu by strategically reducing the power and shortening the time of plasma treatment. The resulting semiconductor devices exhibit improved dimensional accuracy, increased operating speed and improved reliability.

The present invention enjoys industrial applicability in manufacturing highly integrated semiconductor devices exhibiting increased circuit speed. The present invention enjoys particular applicability in fabricating semiconductor devices with sub-micron dimensions, e.g., with a design rule of about 0.12 microns and under.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of fabricating a semiconductor device, the method comprising:

forming an opening in an upper surface of a porous low-k dielectric layer;

filling the opening with copper (Cu) or a Cu alloy;

conducting chemical-mechanical polishing (CMP) leaving this upper surface of the Cu or Cu alloy exposed; and treating the upper surface of the Cu or Cu alloy with a plasma while controlling plasma conditions to avoid etching the upper surface of the porous low-k material.

2. The method according to claim 1, further comprising depositing a capping layer on the treated upper surface of the Cu or Cu alloy.

3. The method according to claim 2, comprising depositing silicon nitride or silicon carbide as the capping layer.

4. The method according to claim 1, comprising treating the upper surface of the Cu or Cu alloy in an ammonia ($NH_3$) or hydrogen ($H_2$) plasma.

5. The method according to claim 4, comprising treating the upper surface of the Cu or Cu alloy with the plasma at a power of 75 to 125 watts.

6. The method according to claim 5, comprising treating the upper surface of the Cu or Cu alloy with the plasma for 2 to 8 seconds.

7. The method according to claim 4, comprising treating the upper surface of the Cu or Cu alloy with a plasma for 2 to 8 seconds.

8. The method according to claim 4, comprising treating the upper surface of the Cu or Cu alloy with an $NH_3$ plasma at:
an $NH_3$ flow rate of 100 to 700 sccm;
a nitrogen ($N_2$) flow rate of 2,000 to 9,000 sccm;
a power of 35 to 125 watts;
a pressure of 4.0 to 5.2 torr; and
a temperature of 300° C. to 400° C.; for 2 to 8 seconds.

9. The method according to claim 4, comprising treating the upper surface of the Cu or Cu alloy with an $H_2$ plasma at:
a $H_2$ flow rate of 100 to 400 sccm;
an $N_2$ flow rate of 200 to 8,000 sccm;
a power of 75 to 125 watts;
a pressure of 4.0 to 5.2 torr; and
a temperature of 300° C. to 400° C.; for 2 to 8 seconds.

10. The method according to claim 4, comprising forming the opening in a dielectric layer having a dielectric constant (k) up to 2.4.

11. The method according to claim 10, comprising forming the opening in a dielectric layer having a k value of 2.0 to 2.2.

12. The method according to claim 4, comprising forming the opening as a dual damascene opening.

13. The method according to claim 1, comprising depositing a barrier metal layer lining the opening before filling the opening with the Cu or the Cu alloy.

14. The method according to claim 13, comprising depositing tantalum, tantalum nitride, or a composite of tantalum nitride and alpha (α)-tantalum, as the barrier metal layer.

15. A method of fabricating a semiconductor device, the method comprising:
forming a dual damascene opening in an upper surface of a porous dielectric layer having a dielectric constant (k) up to 2.4;
depositing a barrier metal layer lining the opening;
filling the opening with copper (Cu) or a Cu alloy;
conducting chemical-mechanical polishing (CMP) leaving an upper surface of the Cu or Cu alloy exposed;
treating the exposed upper surface of the Cu or Cu alloy in an ammonia ($NH_3$) or a hydrogen ($H_2$) plasma at a power of 75 to 125 watts for 2 to 8 seconds; and
depositing a capping layer.

16. The method according to claim 15, comprising treating the exposed upper surface of the Cu or Cu alloy in the plasma at:
an $NH_3$ flow rate of 100 to 700 sccm;
a nitrogen ($N_2$) flow rate of 2,000 to 9,000 sccm;
a pressure of 4.0 to 5.2 torr; and
at a temperature of 300° C. to 400° C.

17. The method according to claim 15, comprising treating the exposed upper surface of the Cu or Cu alloy with the plasma at:
a $H_2$ flow rate of 100 to 400 sccm;
a nitrogen ($N_2$) flow rate of 200 to 8,000 sccm;
a pressure of 4.0 to 5.2 torr; and
a temperature of 300° C. to 400° C.

18. The method according to claim 15, comprising forming the opening in a dielectric layer have a k value of 2.0 to 2.2.

19. A method according to claim 15, comprising depositing silicon nitride or silicon carbide as the capping layer.

20. The method according to claim 15, comprising depositing a layer of tantalum, tantalum nitride, or a composite of tantalum nitride and alpha (α)-tantalum, as the barrier metal layer.

* * * * *